US009406841B2

(12) United States Patent
Yamagishi et al.

(10) Patent No.: US 9,406,841 B2
(45) Date of Patent: Aug. 2, 2016

(54) LIGHT EMITTING DEVICE MANUFACTURING METHOD AND LIGHT EMITTING DEVICE

(71) Applicant: KANEKA CORPORATION, Osaka-shi, Osaka (JP)

(72) Inventors: Hideo Yamagishi, Tsukuba (JP); Akimine Hayashi, Kobe (JP)

(73) Assignee: KANEKA CORPORATION, Osaka-shi (JP)

(*) Notice: Subject to any disclaimer, the term of this patent is extended or adjusted under 35 U.S.C. 154(b) by 0 days.

(21) Appl. No.: 14/478,874

(22) Filed: Sep. 5, 2014

(65) Prior Publication Data

US 2014/0374781 A1    Dec. 25, 2014

Related U.S. Application Data

(63) Continuation of application No. PCT/JP2013/000469, filed on Jan. 29, 2013.

(30) Foreign Application Priority Data

Mar. 7, 2012   (JP) .................................. 2012-050571

(51) Int. Cl.
    *H01L 33/08*    (2010.01)
    *H01L 27/32*    (2006.01)
    (Continued)

(52) U.S. Cl.
    CPC .............. *H01L 33/08* (2013.01); *C23C 14/042* (2013.01); *H01L 27/3213* (2013.01);
    (Continued)

(58) Field of Classification Search
    None
    See application file for complete search history.

(56) References Cited

U.S. PATENT DOCUMENTS 6,919,681 B2 *   7/2005   Cok ..................... G09G 3/3216
                                                      313/500
7,615,790 B2 *   11/2009  Lee ..................... H01L 27/3211
                                                      257/40
(Continued)

FOREIGN PATENT DOCUMENTS

JP      2004335467 A    11/2004
JP      2007067416 A     3/2007
(Continued)

OTHER PUBLICATIONS

ISA Japanese Patent Office, International Search Report of PCT/JP2013/000469, May 7, 2013, 4 pages.
(Continued)

*Primary Examiner* — William Coleman
*Assistant Examiner* — Kien Ly
(74) *Attorney, Agent, or Firm* — Alleman Hall McCoy Russell & Tuttle LLP

(57) ABSTRACT

To improve efficiency when manufacturing a light emitting device formed using a mask to form regions corresponding to pixels on a substrate, provided is a method including, after forming a pattern on a substrate with a first light emitting material that emits light of a first spectrum, through a first opening and one or more second openings of a mask, moving the mask in a longitudinal direction of the first opening by a distance that is less than the width of the first opening in the longitudinal direction of the first opening and greater than or equal to the width of the one or more second openings in the longitudinal direction of the first opening, and then forming a pattern with a second light emitting material that emits light of a second spectrum, through the first opening and the one or more second openings of the mask.

6 Claims, 9 Drawing Sheets

(51) Int. Cl.
*H01L 51/00* (2006.01)
*H01L 51/50* (2006.01)
*C23C 14/04* (2006.01)

(52) U.S. Cl.
CPC ........ *H01L 51/0011* (2013.01); *H01L 27/3216* (2013.01); *H01L 27/3218* (2013.01); *H01L 51/504* (2013.01); *H01L 2933/0025* (2013.01)

(56) References Cited

U.S. PATENT DOCUMENTS

| | | | | |
|---|---|---|---|---|
| 7,704,326 | B2* | 4/2010 | Hagiwara | C23C 14/042 118/504 |
| 7,714,507 | B2* | 5/2010 | Kai | H01L 27/3213 313/504 |
| 2001/0030508 | A1* | 10/2001 | Utsugi | H01L 27/3211 313/505 |
| 2003/0122140 | A1 | 7/2003 | Yamazaki et al. | |
| 2005/0123676 | A1* | 6/2005 | Kuwahara | C23C 14/042 427/66 |
| 2005/0166842 | A1* | 8/2005 | Sakamoto | C23C 14/042 118/721 |
| 2006/0191864 | A1* | 8/2006 | Yotsuya | C23C 14/042 216/41 |
| 2007/0290955 | A1* | 12/2007 | Tsujimura | H01L 27/3211 345/76 |
| 2009/0231243 | A1* | 9/2009 | Song | H01L 27/3211 345/76 |
| 2010/0039011 | A1* | 2/2010 | Karaki | H01L 27/3211 313/1 |
| 2010/0053043 | A1* | 3/2010 | Sakamoto | H01L 27/3213 345/77 |
| 2011/0180825 | A1* | 7/2011 | Lee | H01L 27/3211 257/89 |

FOREIGN PATENT DOCUMENTS

| | | |
|---|---|---|
| JP | 2007234268 A | 9/2007 |
| JP | 2010040529 A | 2/2010 |
| JP | 2011165581 A | 8/2011 |
| WO | 2010114582 A1 | 10/2010 |

OTHER PUBLICATIONS

International Bureau of WIPO, International Preliminary Report on Patentability in International Application No. PCT/JP2013/000469, Sep. 18, 2014, WIPO, 7 pages.
European Patent Office, Extended European Search Report Issued in Application No. 13757930.6, Sep. 30, 2015, 7 pages.

* cited by examiner

LIGHT EMITTING DEVICE MANUFACTURING METHOD AND LIGHT EMITTING DEVICE

CROSS-REFERENCE TO RELATED APPLICATIONS

This application is a continuation of International PCT Application Ser. No. PCT/JP2013/000469 filed on Jan. 29, 2013, which claims priority to Japanese Patent Application No. 2012-050571 filed on Mar. 7, 2012, both of which are hereby incorporated by reference in their entirety for all purposes.

BACKGROUND

1. Technical Field

The present invention relates to a light emitting device manufacturing method and a light emitting device.

2. Related Art

A conventional method is known that includes using a mask and depositing a light emitting layer on regions corresponding respectively to pixels on a substrate, as shown by Patent Documents 1 and 2, for example.
Patent Document 1: Japanese Patent Application Publication No. 2011-165581
Patent Document 2: Japanese Patent Application Publication No. 2010-40529

In a light emitting device manufacturing method that uses a mask and deposits a light emitting layer on regions corresponding respectively to pixels on a substrate, greater efficiency is desired in the steps of the manufacturing process.

SUMMARY

According to a first aspect of the present invention, provided is a light emitting device manufacturing method comprising mask arrangement of arranging a mask that includes a first opening and one or more second openings, which are arranged along a longitudinal direction of the first opening, on a substrate; first pattern formation of, after the mask arrangement, forming a pattern on the substrate with a first light emitting material that emits light of a first spectrum, through the first opening and the one or more second openings of the mask; first mask movement of, after the first pattern formation, moving the mask in the longitudinal direction of the first opening by a distance that is less than a width of the first opening in the longitudinal direction of the first opening and greater than or equal to a width of the one or more second openings in the longitudinal direction of the first opening; and second pattern formation of, after the first mask movement, forming a pattern on the substrate with a second light emitting material that emits light of a second spectrum that differs from the first spectrum, through the first opening and the one or more second openings of the mask.

In the light emitting device manufacturing method, the first mask movement may include moving the mask in the longitudinal direction of the first opening by a distance that is substantially half of a distance between centers of two adjacent second openings among the one or more second openings arranged at uniform intervals.

The light emitting device manufacturing method may further comprise second mask movement of, after the second pattern formation, moving the mask in the longitudinal direction of the first opening by a distance that is less than the width of the first opening in the longitudinal direction of the first opening and greater than or equal to the width of the one or more second openings in the longitudinal direction of the first opening; and third pattern formation of, after the second mask movement, forming a pattern with a third light emitting material that emits light of a third spectrum that differs from the first spectrum and the second spectrum, through the first opening and the one or more second openings of the mask.

In the light emitting device manufacturing method, the first mask movement may include moving the mask in the longitudinal direction of the first opening by a distance that is substantially one third of a distance between centers of two adjacent second openings among the one or more second openings, and the second mask movement may include moving the mask in the longitudinal direction of the first opening by the distance that is substantially one third of the distance between centers of the two adjacent second openings among the one or more second openings.

The light emitting device manufacturing method may further comprise fourth mask movement of moving the mask in a crosswise direction of the first opening by a distance that is greater than a sum of a width of the first opening in the crosswise direction of the first opening and a width of the one or more second openings in the crosswise direction of the first opening; and fourth pattern formation of, after the fourth mask movement, forming a pattern on the substrate with the first light emitting material, through the first opening and the one or more second openings of the mask.

The light emitting device manufacturing method may further comprise fifth mask movement of, after the fourth pattern formation, moving the mask in the longitudinal direction of the first opening by a distance that is less than the width of the first opening in the longitudinal direction of the first opening and greater than or equal to the width of the one or more second openings in the longitudinal direction of the first opening; and fifth pattern formation of, after the fifth mask movement, forming a pattern on the substrate with the second light emitting material, through the first opening and the one or more second openings of the mask.

According to a second aspect of the present invention, provided is a light emitting device comprising a first electrode layer and a second electrode layer; and a light emitting material layer that is arranged between the first electrode layer and the second electrode layer. The light emitting material layer includes a first light emitting layer formed of a first light emitting material that emits light in a first spectrum; and a second light emitting layer that has substantially the same shape as the first light emitting layer, is layered in a range from a position on the first light emitting layer shifted by a predetermined distance in a surface direction relative to the first light emitting layer to a position within the same plane as the first light emitting layer, and is formed of a second light emitting material that emits light in a second spectrum differing from the first spectrum.

In the light emitting device, the light emitting material layer may include a third light emitting layer formed of the first light emitting material in a first region within the same plane as the first light emitting layer; and a fourth light emitting layer formed of the second light emitting material in a second region within the same plane as the first light emitting layer, and distance between a center of the third light emitting layer and a center of the fourth light emitting layer may be the predetermined distance.

In the light emitting device, the third light emitting layer and the fourth light emitting layer may be arranged along a longitudinal direction of the first light emitting layer and the second light emitting layer.

In the light emitting device, the third light emitting layer and the fourth light emitting layer may be arranged adjacent to a region where the first light emitting layer and the second light emitting layer overlap.

In the light emitting device, the light emitting material layer may further include a fifth light emitting layer that has substantially the same shape as the first light emitting layer and the second light emitting layer, is layered in a range from a position on the second light emitting layer shifted by the predetermined distance in the surface direction relative to the second light emitting layer to a position within the same plane as the first light emitting layer, and is formed of a third light emitting material that emits light in a third spectrum differing from the first spectrum and the second spectrum.

In the light emitting device, the light emitting material layer may further include a sixth light emitting layer that is formed of the third light emitting material in a third region within the same plane as the first light emitting layer.

In the light emitting device, the sixth light emitting layer may be arranged in line with the third light emitting layer and the fourth light emitting layer along the longitudinal direction of the first light emitting layer, the second light emitting layer, and the fifth light emitting layer.

In the light emitting device, the sixth light emitting layer may be arranged adjacent to a region where the first light emitting layer, the second light emitting layer, and the fifth light emitting layer overlap.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
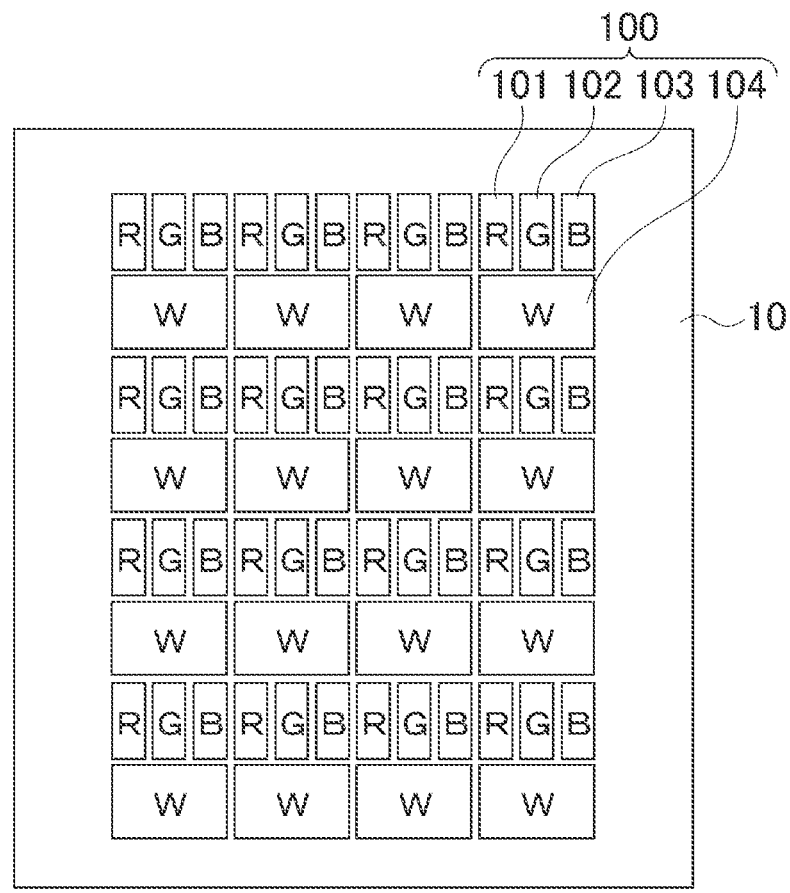
FIG. 1 is a planar view of a light emitting device according to an embodiment of the present invention.

FIG. 1 is a planar view of a light emitting device according to an embodiment of the present invention. The light emitting device includes a substrate 10. The substrate 10 includes a first light emitting layer region 101, a second light emitting layer region 102, a third light emitting layer region 103, and a fourth light emitting layer region 104, which are arranged with intervals therebetween. A red light emitting layer that emits red R light, which is an example of light in a first spectrum, is formed on the first light emitting layer region 101. A green light emitting layer that emits green G light, which is an example of light in a second spectrum differing from the first spectrum, is formed on the second light emitting layer region 102. A blue light emitting layer that emits blue B light, which is an example of light in a third spectrum differing from the first spectrum and the second spectrum, is formed on the third light emitting layer region 103. A white light emitting layer that emits white W light, which is an example of light resulting from a mixture of light in the first spectrum, the second spectrum, and the third spectrum, is formed on the fourth light emitting layer region 104. The first light emitting layer region 101, the second light emitting layer region 102, the third light emitting layer region 103, and the fourth light emitting layer region 104 each form one sub-pixel, and one pixel is formed by the first light emitting layer region 101, the second light emitting layer region 102, the third light emitting layer region 103, and the fourth light emitting layer region 104 together.

The light emitting device causes the light emitting layers of each of the first light emitting layer region 101, the second light emitting layer region 102, the third light emitting layer region 103, and the fourth light emitting layer region 104 to emit light simultaneously. As a result, the light emitting device causes a person who receives the light emitted from the light emitting layers to be aware that white light having a predetermined color temperature is emitted.

Figure 2A:
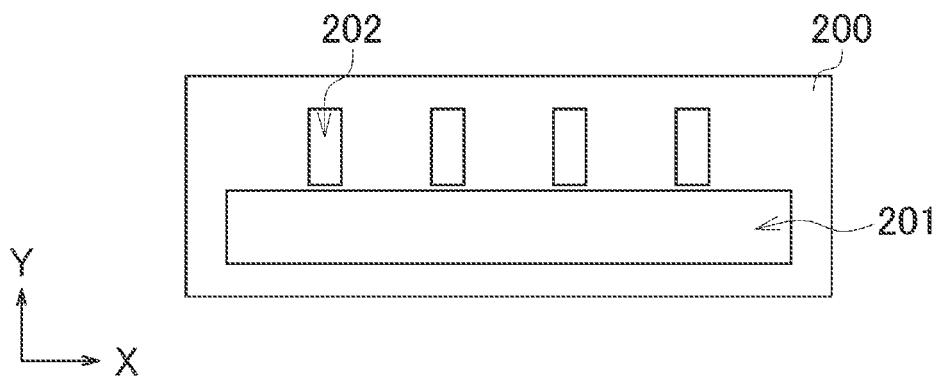
FIG. 2A is a planar view of the mask.

FIG. 2A is a planar view of a mask 200 used when depositing the light emitting material on each of the first light emitting layer region 101, the second light emitting layer region 102, the third light emitting layer region 103, and the fourth light emitting layer region 104 above the substrate 10 of the light emitting device according to the present embodiment.

The mask 200 includes a first opening 201 and a plurality of second openings 202 that are formed along the longitudinal direction X of the first opening 201. The distance between the centers of the second openings 202 is the same as the distance between the centers of a plurality of first light emitting layer regions 101, a plurality of second light emitting layer regions 102, and a plurality of third light emitting layer regions 103. In other words, the distance between the centers of the second openings 202 is three times the distance between one first light emitting layer region 101 and one second light emitting layer region 102 that is adjacent to the one first light emitting layer region 101.

Figure 2B:
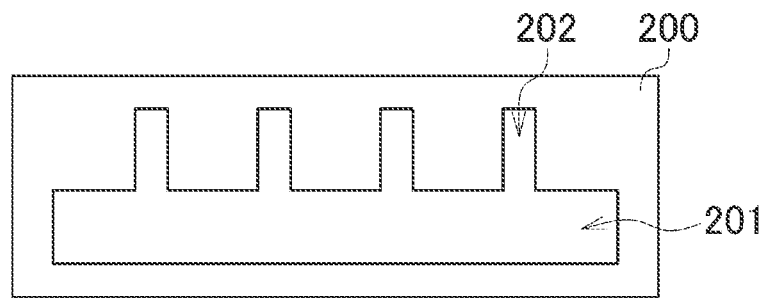
FIG. 2B is a planar view of the mask.

By repeatedly depositing the light emitting material using the mask 200 and then moving the mask 200 in the longitudinal direction X or the crosswise direction Y, the red light emitting layer, the green light emitting layer, the blue light emitting layer, and the white light emitting layer are formed on the respective light emitting layer regions above the substrate 10. The first opening 201 and second openings 202 of the mask 200 may be formed as a single opening, as shown in FIG. 2B. Furthermore, the mask 200 may include at least one second opening 202.

FIGS. 3A, 3B, 3C, 3D, 3E, 3F, 3G, and 3H describe each step in the process of manufacturing the light emitting device according to the present embodiment.

Figure 3A:
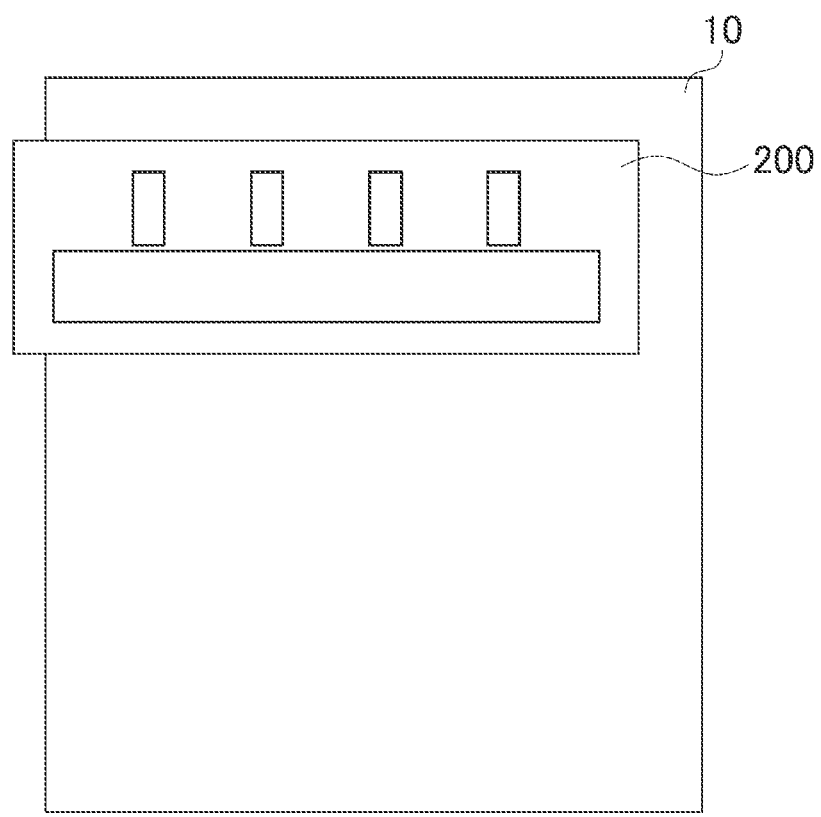
FIG. 3A is a view for describing a step in the process of manufacturing the light emitting device according to the present embodiment.
Figure 3B:
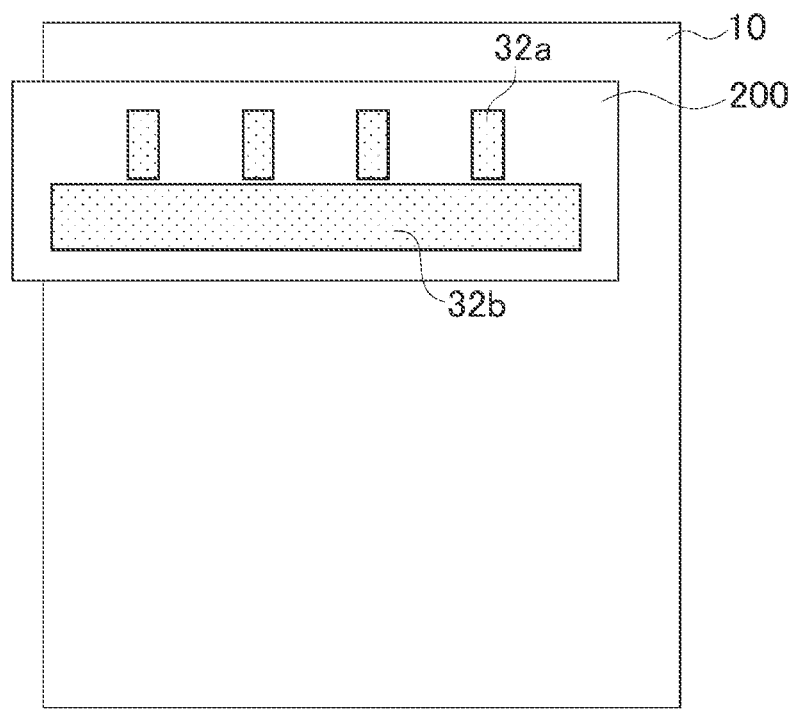
FIG. 3B is a view for describing a step in the process of manufacturing the light emitting device according to the present embodiment.

In the mask 200, a predetermined position on the substrate 10, e.g. the leftmost second opening 202 in FIG. 3A, is arranged at a position corresponding to the uppermost and leftmost first light emitting layer region 102 among the first light emitting layer regions 101 of the substrate 10 (FIG. 3A). After the mask arrangement step, the first light emitting material for emitting light in the first spectrum corresponding to red R is deposited with a mask, for example, through the first opening 201 and the second openings 202 of the mask 200, thereby forming a pattern on the substrate 10 with the first light emitting material. As a result, a plurality of the red light emitting layers 32a and red light emitting layers 32b are formed on the substrate 10. The red light emitting layer 32a is an example of a "third light emitting layer." The red light emitting layer 32b is an example of a "first light emitting layer."

Figure 3C:
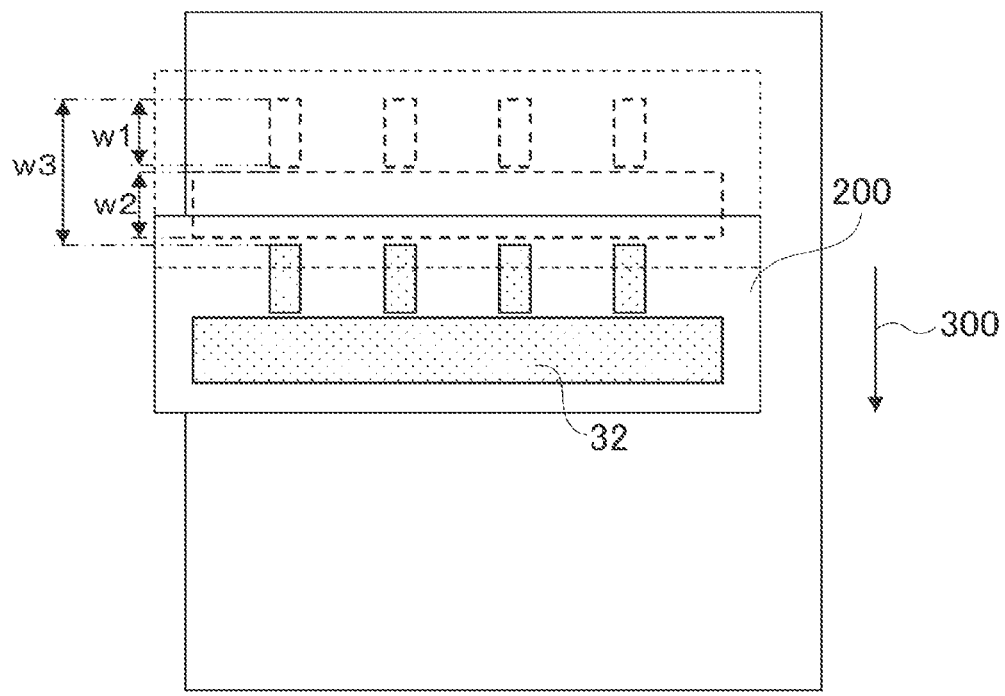
FIG. 3C is a view for describing a step in the process of manufacturing the light emitting device according to the present embodiment.
Figure 3D:
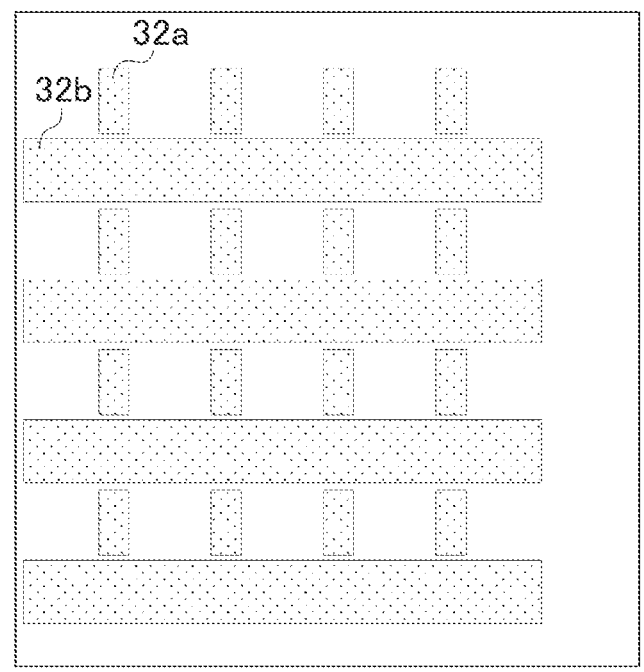
FIG. 3D is a view for describing a step in the process of manufacturing the light emitting device according to the present embodiment.

Next, the mask 200 is moved in the crosswise direction of the first opening, by a distance w3 that is longer than the sum of the width w2 of the first opening in the crosswise direction of the first opening 201 and the width w1 of the plurality of second openings 202 in the crosswise direction of the first opening 201. After the mask 200 has been moved in the crosswise direction, a pattern is again formed on the substrate 10 with the first light emitting material, through the first opening 201 and the second openings 202 of the mask 200 (FIG. 3C). By repeatedly moving the mask 200 in the crosswise direction 300 and depositing the first light emitting material with the mask, a plurality of red light emitting layers 32a and red light emitting layers 32b are formed on the substrate 10 (FIG. 3D).

Figure 3E:
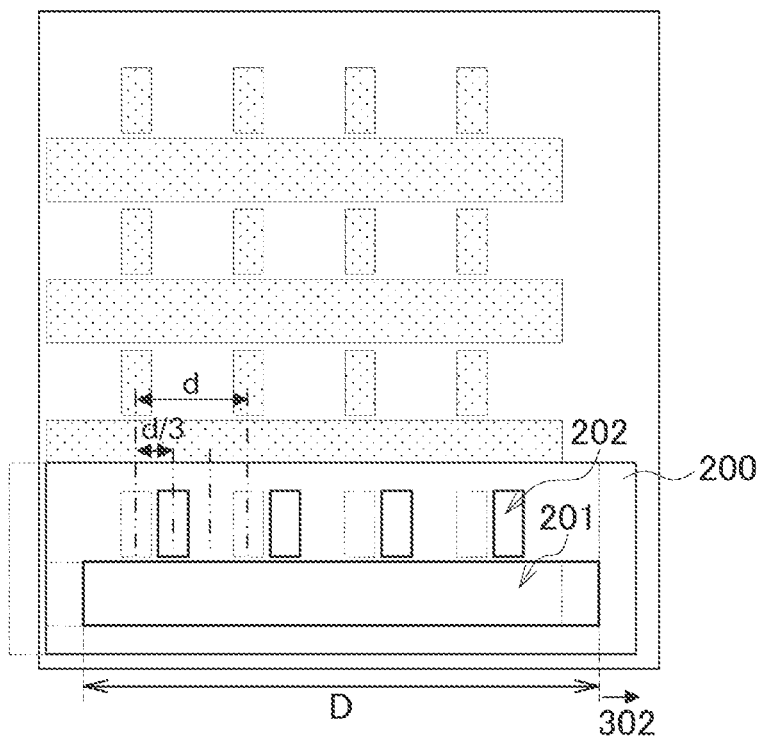
FIG. 3E is a view for describing a step in the process of manufacturing the light emitting device according to the present embodiment.
Figure 3F:
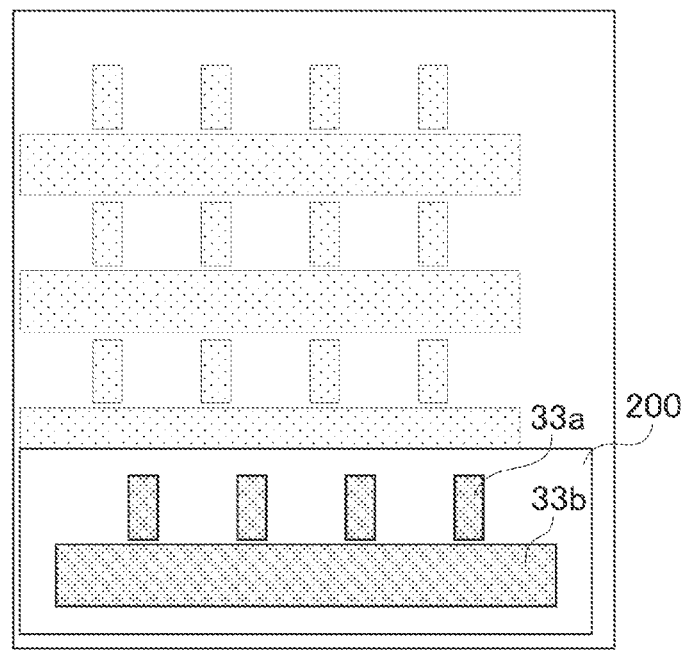
FIG. 3F is a view for describing a step in the process of manufacturing the light emitting device according to the present embodiment.

Next, the mask 200 is moved in the longitudinal direction 302 of the first opening 201, by a distance that is greater than or equal to the widths of the second openings 202 in the longitudinal direction 302 of the first opening 201 and less than the width D of the first opening 201 in the longitudinal direction 302 of the first opening 201 (FIG. 3E). More specifically, the mask 200 is moved in the longitudinal direction 302 of the first opening 201 by a distance d/3 that is substantially one third of the distance d between the centers of two adjacent second openings 202 among the plurality of second openings 202. After the mask 200 is moved in the longitudinal direction 302, the second light emitting material for emitting light of the second spectrum that is different from the first spectrum and corresponds to green light is deposited through the first opening 201 and the second openings 202 of the mask 200, thereby forming a pattern with the second light emitting material on the substrate 10 (FIG. 3F). As a result, a plurality of green light emitting layers 33a and green light emitting layers 33b are formed on the substrate 10. The green light emitting layer 33a is an example of a "fourth light emitting layer." The green light emitting layer 33b is an example of a "second light emitting layer."

Figure 3G:
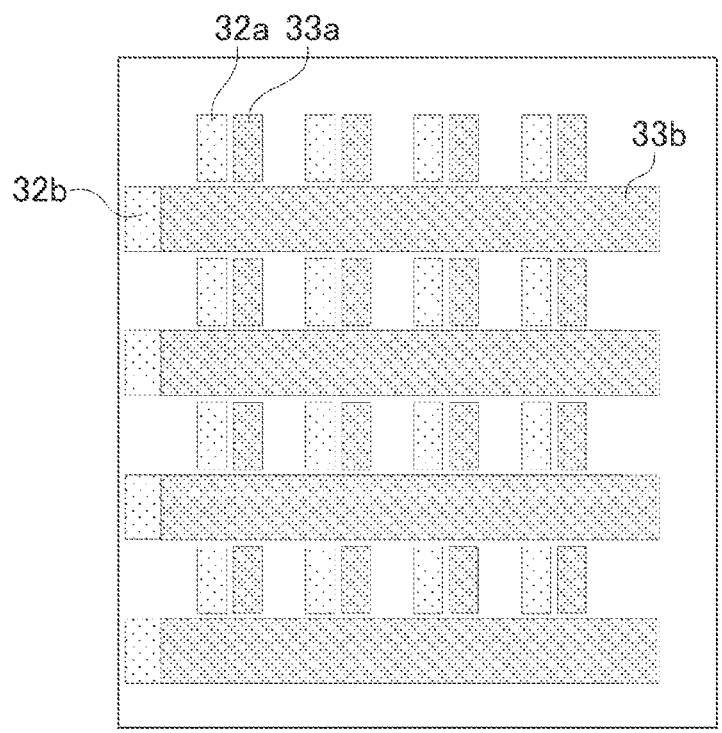
FIG. 3G is a view for describing a step in the process of manufacturing the light emitting device according to the present embodiment.

The process of moving the mask 200 in the crosswise direction 300 of the first opening, by a distance w3 that is greater than the sum of the width w2 of the first opening in the crosswise direction 300 of the first opening 201 and the width w1 of the plurality of second openings 202 in the crosswise direction 300 of the first opening 201, and forming a pattern on the substrate 10 with a second light emitting material through the first opening 201 and the second openings 202 of the mask 200 is repeated, thereby forming a plurality of green light emitting layers 33a and green light emitting layers 33b on the substrate 10 (FIG. 3G).

Figure 3H:
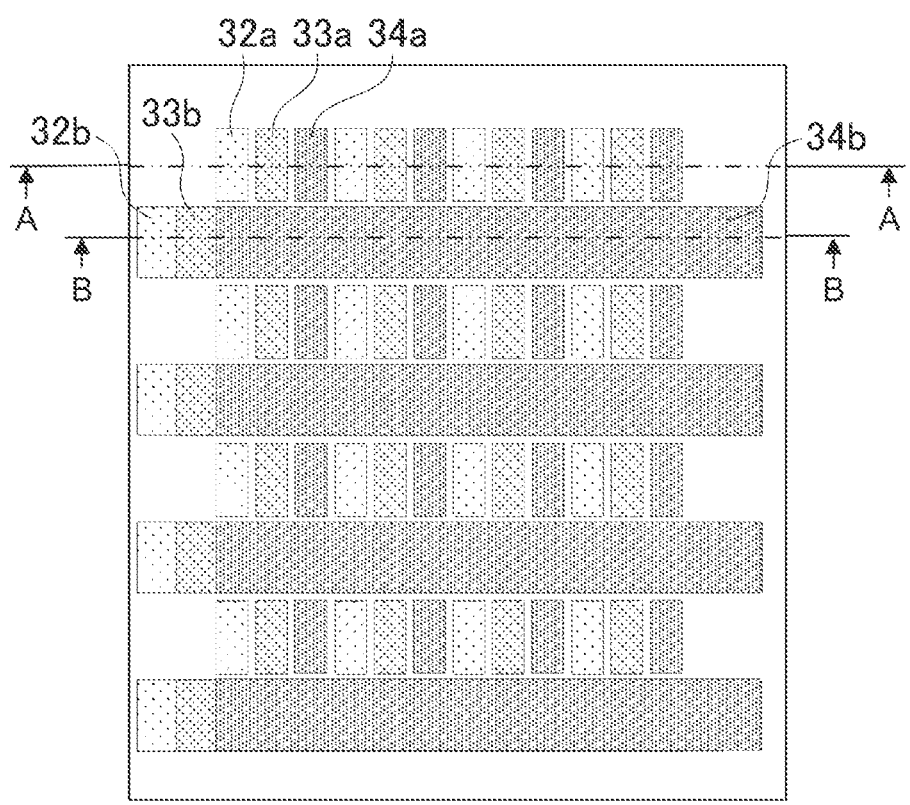
FIG. 3H is a view for describing a step in the process of manufacturing the light emitting device according to the present embodiment.

Next, after the plurality of green light emitting layers 33a and green light emitting layers 33b have been formed, the mask 200 is moved in the longitudinal direction of the first opening 201, by a distance d/3 that is greater than or equal to the widths of the second openings 202 in the longitudinal direction of the first opening 201 and less than the width of the first opening 201 in the longitudinal direction of the first opening 201. Furthermore, a third light emitting material that emits light in a third spectrum that is different from the first spectrum and second spectrum and corresponds to blue is deposited with a mask through the first opening 201 and the second openings 202 of the mask 200, thereby forming a pattern with the third light emitting material. Next, the mask 200 is moved in the crosswise direction 300 of the first opening, by a distance w3 that is greater than the that is greater than the sum of the width w2 of the first opening in the crosswise direction 300 of the first opening 201 and the width w1 of the plurality of second openings 202 in the crosswise direction 300 of the first opening 201, and a pattern is formed with the third light emitting material through the first opening 201 and the second openings 202 of the mask 200. The movement of the mask 200 in the crosswise direction and the pattern formation with the third light emitting material using the mask 200 are repeated, thereby forming a plurality of blue light emitting layers 34a and blue light emitting layers 34b on the substrate (FIG. 3H). The blue light emitting layer 34a is an example of a "sixth light emitting layer." The blue light emitting layer 34b is an example of a "fifth light emitting layer."

As a result of the steps described above, a light emitting layer can be formed above the substrate 10. With the light emitting device manufacturing method of the present embodiment, it is possible to simultaneously form a multi-layer light emitting layer that emits light with a plurality of colors and a single light emitting layer that emits light in a single color respectively in different regions above the substrate 10, using the same mask. Accordingly, the steps for manufacturing the light emitting device can be made more efficient, and the manufacturing cost of the light emitting device can be reduced.

Figure 4A:
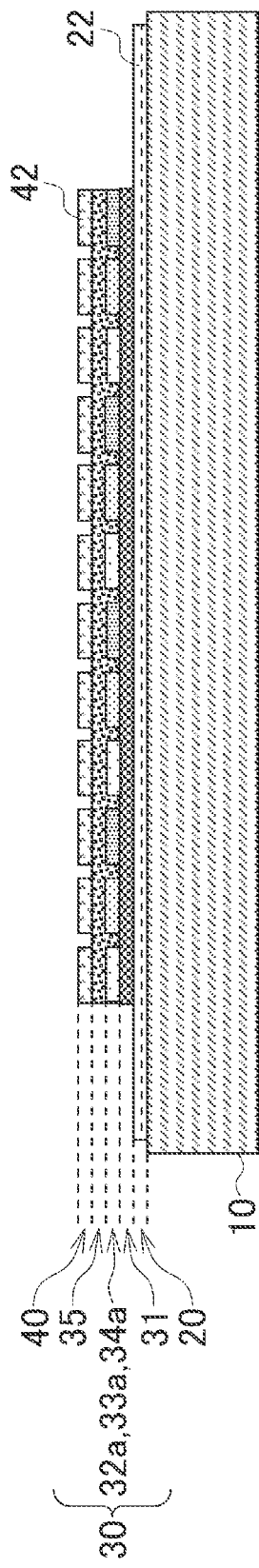
FIG. 4A is a cross-sectional view over the line A-A shown in FIG. 3H.
Figure 4B:
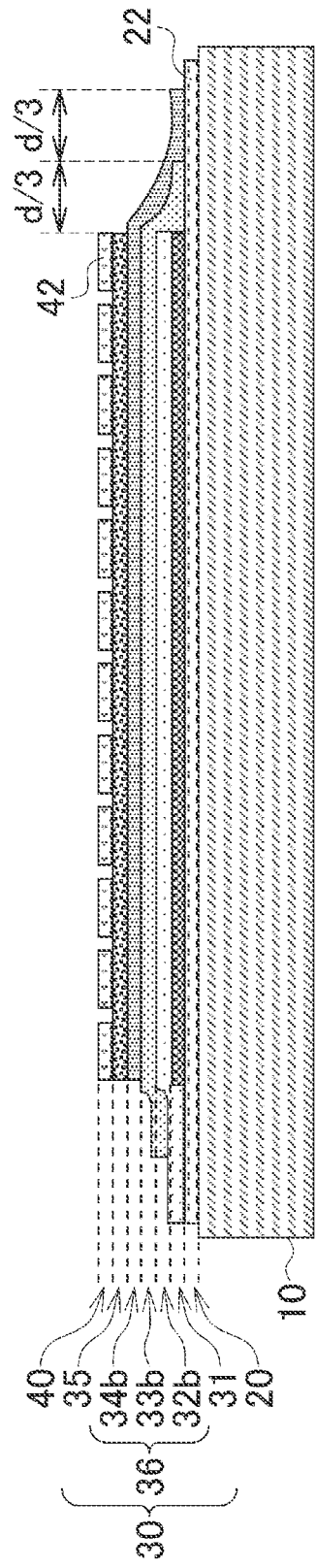
FIG. 4B is a cross-sectional view over the line B-B shown in FIG. 3H.

FIG. 4A is a cross-sectional view of the light emitting device according to the present embodiment, over the line A-A shown in FIG. 3H. FIG. 4B is a cross-sectional view of the light emitting device according to the present embodiment, over the line B-B shown in FIG. 3H.

The light emitting device according to the present embodiment includes the substrate 10, a first electrode layer 20, a light emitting material layer 30, and a second electrode layer 40. The light emitting material layer 30 is arranged between the first electrode layer 20 and the second electrode layer 40. The light emitting device is a so-called bottom emission organic EL light emitting device. The light emitting device may instead be a so-called top emission organic EL light emitting device or a side light extraction organic EL light emitting device.

The substrate 10 can use a board that is optically transparent, such as glass or a polymer film. The first electrode layer 20 is an anode, and may be a transparent conductive film. The first electrode layer 20 may be formed by an optically transparent conductive material. Here, "optically transparent" means having the property of transmitting light. The optically transparent conductive material refers to a material for which the transmittance of light in the visible light region (350 nm to 780 nm) is always greater than 50% and the surface resistance value is no greater than $10^7 \Omega$. Specifically, the optically transparent conductive material can be indium-doped tin oxide (ITO), indium-doped zinc oxide (IZO), tin oxide, zinc oxide, or the like. In consideration of a low surface resistance, it is preferable to form the first electrode layer 20 using indium-doped tin oxide. The first electrode layer 20 is formed by forming an ITO film on the substrate 10 using sputtering, vapor deposition, pulse laser deposition, or the like. The first electrode layer 20 includes a plurality of first electrodes 22 that are arranged in a belt along a first direction, i.e. the longitudinal direction of the mask 200. The first electrode layer 20 may include one first electrode 22 that is a shared electrode.

The second electrode layer 40 is a cathode and is arranged above the light emitting material layer 30. The second electrode layer 40 is formed on the light emitting material layer 30 through vapor deposition, sputtering, or the like using a conductive material such as Al or Ag. In the case of a bottom emission organic EL light emitting device that extracts light from the substrate 10 side, there is no need for the second electrode layer 40 to be optically transparent. On the other hand, in the case of a top emission or side extraction organic EL light emitting device, the second electrode layer 40 is formed of a transparent conductive material. In this case, the second electrode layer 40 may be formed of the same material as used for the first electrode layer 20. In the present embodiment, the second electrode layer 40 is arranged on the light emitting material layer 30. However, during the process of manufacturing the light emitting device, in consideration of restricting degradation of each layer forming the light emitting material layer 30 due to moisture absorption, another conductive layer that is separate from the second electrode layer 40 may be formed as a buffer layer on the outermost surface of the light emitting material layer 30, i.e. the boundary surface with the second electrode layer 40. The second electrode layer 40 includes a plurality of second electrodes 42 arranged in a belt along a second direction, i.e. the crosswise direction of the mask 200, that is perpendicular to the first direction.

By applying a drive voltage simultaneously or individually to each of the first electrodes 22 and the second electrodes 42, light is emitted from the light emitting material layer 30 in regions where the first electrodes and the second electrodes to which the drive voltage is applied, from the plurality of first electrodes 22 and plurality of second electrodes 42, intersect.

The light emitting material layer 30 indicates a portion sandwiched between the anode and the cathode in a general organic EL element, and includes an electron injection layer, an electron transport layer, a light emitting layer, a hole injection layer, a hole transport layer, and the like. The light emitting material layer 30 may be formed using a thin film of alkali metal or inorganic material, instead of an organic compound.

The light emitting material layer 30 includes a set of a hole injection layer and hole transport layer 31 and a set of an electron injection layer and electron transport layer 35. The light emitting material layer 30 includes a red light emitting layer 32a, a green light emitting layer 33a, a blue light emitting layer 34a, or a white light emitting layer 36 between the set of the hole injection layer and hole transport layer 31 and the electron injection layer and electron transport layer 35. The white light emitting layer 36 includes a red light emitting layer 32b, a green light emitting layer 33b, and a blue light emitting layer 34b.

The red light emitting layer 32b is formed of the first light emitting material that emits light in the first spectrum corresponding to red. The green light emitting layer 33b has substantially the same shape as the red light emitting layer 32b as seen from the cathode side, is shifted a predetermined distance d/3 relative to the red light emitting layer 32b in the surface direction and layered in a range from a position on the red light emitting layer 32b to a position in the same plane as the red light emitting layer 32b, and is formed of the second light emitting material that emits light in the second spectrum.

The blue light emitting layer 34b has substantially the same shape as the red light emitting layer 32b and the green light emitting layer 33b as seen from the cathode side, is shifted a predetermined distance d/3 relative to the green light emitting layer 33b in the surface direction and layered in a range from a position on the green light emitting layer 33b to a position in the same plane as the red light emitting layer 32b, and is formed of the third light emitting material that emits light in the third spectrum.

The red light emitting layer 32a is formed of the first light emitting material on the first light emitting layer region 101 in the same plane as the red light emitting layer 32b. The green light emitting layer 33a is formed of the second light emitting material on the second light emitting layer region 102 in the same plane as the red light emitting layer 32a. The blue light emitting layer 34a is formed of the third light emitting material, in the third light emitting layer region 103 within the same plane as the red light emitting layer 32b. The distance between the center of the red light emitting layer 32a and the center of the green light emitting layer 33a and the distance between the center of the green light emitting layer 33a and the center of the blue light emitting layer 34a are each a predetermined distance d/3. The red light emitting layer 32a and the green light emitting layer 33a are arranged along the longitudinal direction of the red light emitting layer 32b and the green light emitting layer 33b. The red light emitting layer 32a and the green light emitting layer 33a are arranged adjacent to the region where the red light emitting layer 32a and the green light emitting layer 33b overlap. The blue light emitting layer 34a is arranged in a line with the red light emitting layer 32a and the green light emitting layer 33a, along the longitudinal direction of the red light emitting layer 32b, the green light emitting layer 33b, and the blue light emitting layer 34b. The red light emitting layer 32a, the green light emitting layer 33a, and the blue light emitting layer 34a are arranged adjacent to the region where the red light emitting layer 32b, the green light emitting layer 33b, and the blue light emitting layer 34b overlap.

With the light emitting device configured in the manner shown above, by causing the red light emitting layers 32a and 32b, the green light emitting layers 33a and 33b, and the blue light emitting layers 34a and 34b to emit light simultaneously, the person who receives the light emitted from each light emitting layer can be made to recognize the emission of white light having a predetermined color temperature.

Figure 5:
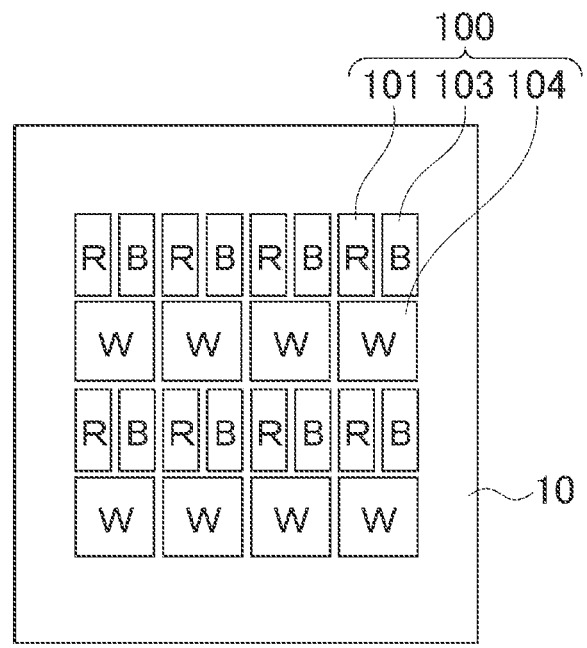
FIG. 5 is a planar view of a light emitting device according to another example.
Figure 6:
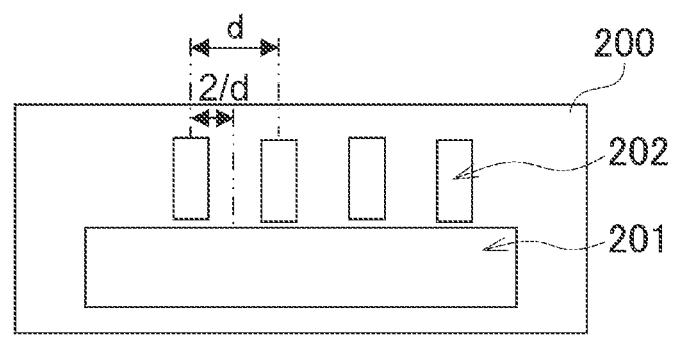
FIG. 6 is a planar view of mask according to another example.

As shown in FIG. 5, the light emitting device may include a plurality of pixels formed by the first light emitting layer region 101, the third light emitting layer region 103, and the fourth light emitting layer region 104. In this case, as shown in FIG. 6, the distances between the centers of the second openings 202 in the mask 200 are the same as the distances between the centers of the first light emitting layer regions 101 or the third light emitting layer regions 103. In other words, the distance between the centers of each set of second openings 202 is a distance d, which is double the distance d/2 between the centers of one first light emitting layer region 101 and one third light emitting layer region 103 adjacent to the one first light emitting layer region 101. In a case of manufacturing the light emitting device using the mask 200 shown in FIG. 6, when the mask 200 moves in the longitudinal direction of the first opening 201, the mask 200 may be moved in the longitudinal direction of the first opening 201 by a distance d/2 that is substantially half of the distance between the centers of two second openings from among the plurality of second openings 202 arranged at uniform intervals. In this way, a single-layer light emitting layer and a multi-layer light emitting layer can be formed at the same time using the same mask.

Figure 7:
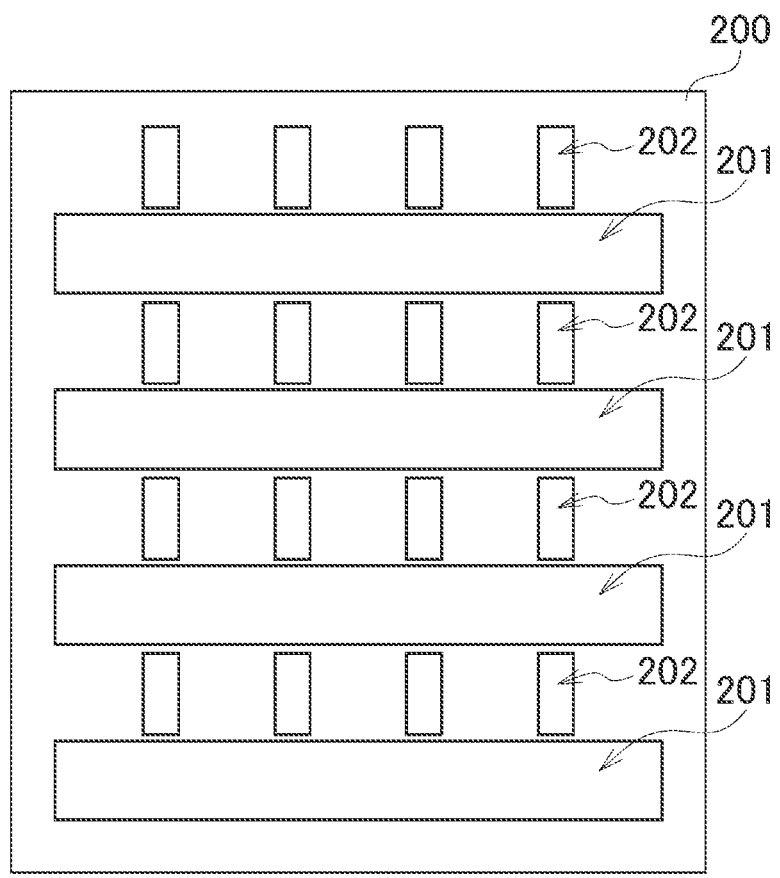
FIG. 7 is a planar view of mask according to another example.

The mask according to the above embodiments is an example that includes only a plurality of second openings 202 and one first opening 201 corresponding to a one-row pixel group arranged on the substrate 10. However, as shown in FIG. 7, the mask 200 may include a plurality of first openings 201 that correspond to a plurality of pixel group rows arranged on the substrate 10 and a plurality of second openings 202 corresponding respectively to the first openings 201. With this type of mask 200, the movement of the first openings 201 in the crosswise direction can be reduced. Accordingly, the manufacturing process can be made even more efficient.

Furthermore, it is not absolutely necessary for the first light emitting layer regions 101, the second light emitting layer regions 102, and the third light emitting layer regions 103 emitting the red light R, green light G, or blue light B, i.e. the light emitting regions other than the fourth light emitting layer regions 104 that are the majority of the area emitting the white light W, to all have the same area, when considering the relationship with the luminous efficiency or the light emitting efficiency. Even if each of the light emitting layers is formed to have the same area, the areas serving as the light emitting regions can be adjusted by adjusting the areas of the anodes or cathodes corresponding to each light emitting region, i.e. the area of the first electrode layer 20 or second electrode layer 40.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

REFERENCE CHARACTER LIST 10 substrate
20 first electrode layer
30 light emitting material layer
32a, 32b red light emitting layer
33a, 33b green light emitting layer
34a, 34b blue light emitting layer
36 white light emitting layer
40 second electrode layer
101 light emitting layer region
102 light emitting layer region
103 light emitting layer region
104 light emitting layer region
200 mask
201 first opening
202 second opening

What is claimed is:

1. A light emitting device manufacturing method comprising:
    mask arrangement of arranging a mask that includes a first opening and one or more second openings that are spaced apart from each other along a plane of the mask, the one or more second openings being arranged adjacent to the first opening along a longitudinal direction of the first opening, on a substrate;
    first pattern formation of, after the mask arrangement, forming a pattern on the substrate with a first light emitting material that emits light of a first spectrum, through the first opening and the one or more second openings of the mask;
    first mask movement of, after the first pattern formation, moving the mask in the longitudinal direction of the first opening by a distance that is less than a width of the first opening in the longitudinal direction of the first opening and greater than or equal to a width of the one or more second openings in the longitudinal direction of the first opening; and
    second pattern formation of, after the first mask movement, forming a pattern on the substrate with a second light emitting material that emits light of a second spectrum that differs from the first spectrum, through the first opening and the one or more second openings of the mask.

2. The light emitting device manufacturing method according to claim 1, wherein
    the first mask movement includes moving the mask in the longitudinal direction of the first opening by a distance that is substantially half of a distance between centers of two adjacent second openings among the one or more second openings arranged at uniform intervals.

3. The light emitting device manufacturing method according to claim 1, further comprising:
    second mask movement of, after the second pattern formation, moving the mask in the longitudinal direction of the first opening by a distance that is less than the width of the first opening in the longitudinal direction of the first opening and greater than or equal to the width of the one or more second openings in the longitudinal direction of the first opening; and
    third pattern formation of, after the second mask movement, forming a pattern with a third light emitting material that emits light of a third spectrum that differs from the first spectrum and the second spectrum, through the first opening and the one or more second openings of the mask.

4. The light emitting device manufacturing method according to claim 3, wherein
    the first mask movement includes moving the mask in the longitudinal direction of the first opening by a distance that is substantially one third of a distance between centers of two adjacent second openings among the one or more second openings, and the second mask movement includes moving the mask in the longitudinal direction of the first opening by the distance that is substantially one third of the distance between centers of the two adjacent second openings among the one or more second openings.

5. The light emitting device manufacturing method according to claim 1, further comprising:

fourth mask movement of moving the mask in a crosswise direction of the first opening by a distance that is greater than a sum of a width of the first opening in the crosswise direction of the first opening and a width of the one or more second openings in the crosswise direction of the first opening; and fourth pattern formation of, after the fourth mask movement, forming a pattern on the substrate with the first light emitting material, through the first opening and the one or more second openings of the mask.

6. The light emitting device manufacturing method according to claim 5, further comprising:

fifth mask movement of, after the fourth pattern formation, moving the mask in the longitudinal direction of the first opening by a distance that is less than the width of the first opening in the longitudinal direction of the first opening and greater than or equal to the width of the one or more second openings in the longitudinal direction of the first opening; and fifth pattern formation of, after the fifth mask movement, forming a pattern on the substrate with the second light emitting material, through the first opening and the one or more second openings of the mask.

* * * * *